United States Patent
Vugrek

[19]

[11] Patent Number: 5,983,582
[45] Date of Patent: Nov. 16, 1999

[54] SEISMIC RESISTANT EQUIPMENT PLATFORMS

[75] Inventor: Andrija Vugrek, Madison, N.J.

[73] Assignee: AT&T Corp., New York, N.Y.

[ * ] Notice: This patent issued on a continued prosecution application filed under 37 CFR 1.53(d), and is subject to the twenty year patent term provisions of 35 U.S.C. 154(a)(2).

[21] Appl. No.: 08/811,983

[22] Filed: Mar. 5, 1997

[51] Int. Cl.$^6$ .................................................. E04D 15/00
[52] U.S. Cl. ............................................. 52/263; 52/126.6
[58] Field of Search ..................................... 52/263, 126.6

[56] References Cited

U.S. PATENT DOCUMENTS

| | | |
|---|---|---|
| 3,150,748 | 9/1964 | Liskey . |
| 3,180,460 | 4/1965 | Liskey . |
| 3,222,030 | 12/1965 | Thorpe . |
| 3,830,024 | 8/1974 | Warnke . |
| 3,924,370 | 12/1975 | Cauceglia et al. . |
| 4,074,488 | 2/1978 | Ray, III .................................. 52/263 X |
| 4,578,910 | 4/1986 | Germeroth et al. ................... 52/263 X |
| 4,596,095 | 6/1986 | Chalfant . |
| 4,630,417 | 12/1986 | Collier ...................................... 52/263 |
| 4,676,036 | 6/1987 | Bessert .................................. 52/263 X |
| 4,759,162 | 7/1988 | Wyse . |
| 4,883,503 | 11/1989 | Fish .......................................... 52/263 |
| 4,901,490 | 2/1990 | Zinniel et al. . |
| 4,922,670 | 5/1990 | Naka et al. . |
| 4,942,708 | 7/1990 | Krumholz et al. ......................... 52/263 |
| 5,048,242 | 9/1991 | Cline . |
| 5,333,423 | 8/1994 | Propst .................................. 52/263 X |
| 5,398,466 | 3/1995 | Oyama et al. ......................... 52/263 X |
| 5,412,914 | 5/1995 | Dew et al. ............................ 52/263 X |
| 5,419,093 | 5/1995 | Wei . |
| 5,459,968 | 10/1995 | Jin ......................................... 52/263 X |
| 5,477,649 | 12/1995 | Bessert . |
| 5,501,754 | 3/1996 | Hiraguri ................................. 52/263 X |

*Primary Examiner*—Beth Aubrey

[57] ABSTRACT

A seismic resistant equipment platform is provided which may be used to stabilize equipment during a seismic event or to provide selective seismic stability within a conventional raised floor. The disclosed seismic resistant equipment platform has an array of pedestals interconnected by equipment mounting plates. Each pedestal includes a base which is mounted to a subfloor, a column which is mounted to the base, and a pedestal head which is mounted to the column. Furthermore, each pedestal head is configured to accept a portion of an equipment mounting plate as well as various stringers which may be used to support conventional floor panels. The pedestals are constructed to have sufficient stiffness to operatively transfer the stiffness of the subfloor to equipment mounting plates interconnecting such pedestals. Further, equipment mounting plates are fabricated to have sufficient stiffness to warrant treating each equipment mounting plate as a rigid body so that pedestal stiffnesses add when pedestals are interconnected by equipment mounting plates.

27 Claims, 2 Drawing Sheets

SEISMIC RESISTANT EQUIPMENT PLATFORMS

BACKGROUND OF THE INVENTION

This invention relates to seismic resistant equipment platforms. The seismic resistant aspect of the invention relates specifically to specially designed equipment platforms which maintain their structural integrity during seismic events and thus have improved seismic stability (i.e., greater stability during a seismic event). Equipment mounted on such equipment platforms is thereby better protected from damage during seismic events because these equipment platforms are able to withstand seismic events of a greater magnitude than previously known platforms. Specifically, these inventive equipment platforms are suitable for zone 0–4 seismic locations, having satisfied all relevant requirements of Bellecore Network Equipment Building Systems (NEBS) Requirements GR-63-CORE (NEBS PR-NWT-0063). Examples of equipment which may be protected by such equipment platforms include telecommunications equipment, computer equipment, rack mountable electronic equipment, pharmaceutical processing equipment, and any other form of electronic or laboratory equipment.

The term "seismic event" used herein refers to an earthquake or other earth vibration which produces seismic waves (e.g., P waves, S waves, Love waves, or Rayleigh waves) which directly or indirectly shake, vibrate, twist, displace, or similarly disturb earth surface structures (e.g., buildings, bridges, homes, etc.). The term "seismic resistant" used herein refers to the characteristic or property of being resistant to damage during a seismic event (e.g., being resistant to damage when shaken, vibrated, twisted, displaced, or similarly disturbed).

In telecommunications and computing facilities, raised floors are often used to support equipment while providing space between a subfloor (the floor on which the raised floor is mounted) and the raised floor for cabling and ancillary equipment (e.g., heating and cooling equipment). A large variety of raised floors are available and are well suited for use in stable environments which lack seismic activity. The majority of raised floors consist of a plurality of pedestals disposed in a rectangular array at regular spacings and interconnected by a plurality of parallel beams (e.g., box or roll formed stringers (hereinafter "stringers")). Each pedestal usually consists of a base, a column, and a pedestal head, with the base of each pedestal being bolted or glued to the subfloor on which the raised floor is to be constructed. The stringers are normally mounted between adjoining pedestal heads. A plurality of removable floor panels are then spanned between adjacent stringers. These floor panels may be attached to the pedestal heads or left free-floating on stringers. In this manner, an entire raised floor can be constructed. Viewed as a whole, such a floor is essentially a plurality of cantilever beams (i.e., the plurality of pedestals) interconnected by floor panels and/or stringers.

While these floors function well in areas free from seismic activity (e.g., stable environments), few have been designed to withstand the substantial forces present during a seismic event. Because each pedestal acts as a cantilever beam, the bending moment of each pedestal is largest at its base. Therefore, during a seismic event, the base of each pedestal is most likely to fail first, each pedestal either snapping off at its base (if constructed from a brittle material) or forming a plastic hinge at its base when the bending moment becomes equal to the fully plastic moment of the pedestal (if constructed from a ductile material). In either case, most raised floors will either collapse or experience some other form of catastrophic failure during a large seismic event, necessarily damaging any equipment mounted on these raised floors. (Such floors are therefore termed "non-seismic" floors.)

In addition to the above described non-seismic floors, a number of raised floors exist which provide some seismic stability but at a level insufficient to protect the heavy equipment typically found in telecommunications installations in zone 4 seismic locations (i.e., insufficient seismic stability to restore up to 2000 lbs. of force at any resonant frequency). Typically, seismic stability is introduced to a raised floor by providing supplemental bracing between the raised floor's pedestals and the subfloor to which the pedestals are mounted so as to selectively strengthen each pedestal's base, or by substantially increasing the diameter of each pedestal (thereby also strengthening each pedestal's base). While somewhat effective for protecting large footprint equipment during seismic events, both techniques significantly reduce the amount of room available for cabling and ancillary equipment underneath the raised floor and both are unable to support the load demands of much of the equipment used in the telecommunications industry (particularly small footprint, bay frame type equipment). (For convenience, hereinafter non-seismic floors and other raised floors which have insufficient seismic stability for heavy equipment applications are referred to collectively as "conventional" raised floors and the various components which comprise such conventional raised floors are referred to as "conventional" components (e.g., conventional pedestals, conventional floor panels, conventional pedestal heads, and the like).)

One method for constructing a seismic resistant raised floor which is suitable for use with telecommunications equipment is to decouple the raised floor from the subfloor on which it is mounted. Such a method is disclosed in U.S. Pat. No. 4,922,670 to Naka et al. (hereinafter "the '670 patent"). The '670 patent discloses a seismic resistant raised floor wherein the floor's pedestals, stringers, and floor panels are interconnected to form one rigid body which is decoupled from the subfloor by pivot points at the base of each pedestal. While this configuration successfully reduces the large bending moment that would otherwise be present at the base of each pedestal (i.e., the location where the bending moment of each pedestal would be the greatest if each pedestal were rigidly coupled to the subfloor), such a configuration lacks lateral support because of the pivot point decoupling. An entire seismic floor of this type would have to be constructed to gain lateral support from the walls of the room in which the floor is located. If a free standing platform were constructed in accordance with the teachings of the '670 patent, without attaching the platform to any walls, the platform would lack lateral support (as it can pivot at the base of each pedestal) and as such would not be seismic resistant. Because the entire floor disclosed in the '670 patent must be constructed in order to provide protection during a seismic event, a major drawback of the raised floor of the '670 patent is the cost of building an entire floor which is seismic resistant when such protection is only required in areas where equipment is located.

A need therefore exists for a seismic resistant raised platform which does not require an entire seismic resistant raised floor to be constructed.

It is therefore an object of this invention to provide a seismic resistant equipment platform which does not require supplemental lateral support.

It is a more particular object of this invention to provide a seismic resistant equipment platform which is not decoupled from the subfloor on which it is mounted.

It is a further object of this invention to provide a seismic resistant equipment platform which can be coupled to a conventional raised floor so as to provide selective seismic stability within the conventional raised floor.

SUMMARY OF THE INVENTION

These and other objects of the invention are accomplished in accordance with the principles of the invention by providing a seismic resistant equipment platform which may be used to stabilize equipment during a seismic event.

The seismic resistant equipment platform of the present invention comprises an array, usually rectangular, of pedestals interconnected by equipment mounting plates. Each pedestal includes a base which is mounted to a subfloor, a column which is mounted to the base, and a pedestal head which is mounted to the column. Furthermore, each pedestal head is configured to accept a portion of an equipment mounting plate.

As an example, an equipment platform containing a single equipment mounting plate may be constructed by attaching four pedestals to a subfloor (e.g., each pedestal's base is bolted to the subfloor) in a rectangular array and by mounting each corner of the equipment mounting plate to a different one of the four pedestal heads. In this manner, an equipment platform consisting of four pedestals mounted to a subfloor and interconnected by an equipment mounting plate is formed. Larger equipment platforms are constructed by adding more pedestals and more equipment mounting plates. Equipment platform size is dictated by the footprint of the equipment to be mounted on the equipment platform, with additional area being provided if needed to effectively mount the equipment on the platform.

To make these equipment platforms seismic resistant, the pedestals are constructed to have sufficient stiffness to operatively transfer the stiffness of the subfloor to equipment mounting plates interconnecting such pedestals. That is, a piece of equipment will experience substantially the same level of seismic stability whether it is mounted directly to a subfloor or mounted to an equipment mounting plate which is part of an equipment platform coupled to the subfloor. Further, equipment mounting plates are fabricated to have sufficient stiffness to warrant treating each equipment mounting plate as a rigid body (i.e., the equipment mounting plates are of sufficient stiffness that deformations of the plates are negligibly small; such deformations may therefore be neglected during force analysis). By making each equipment mounting plate a rigid body, pedestal stiffnesses add when pedestals are interconnected by equipment mounting plates. For example, if each pedestal is sufficiently stiff to elastically restore 500 lbs. of force at any resonant frequency, an equipment platform constructed from four pedestals interconnected by an equipment mounting plate (with stiffness sufficient to warrant rigid-body analysis) will elastically restore 2000 lbs. of force at any resonant frequency. In this manner, individual, small-sized pedestals, which are incapable of restoring a desired force, can be combined to form an equipment platform which is capable of restoring the desired force (e.g., capable of restoring enough force to withstand relatively large seismic events).

In addition, each pedestal is fabricated from a ductile material which undergoes substantial plastic deformation when overloaded, rather than breaking when the maximum tensile strength of the pedestal material is reached. Thus, even if the pedestal is inelastically deformed, it will still support a load (i.e., the failure mode of each pedestal is "substantially plastic").

Equipment placed on these equipment platforms can be mounted directly or indirectly to the equipment mounting plates. The equipment is therefore protected from damage during seismic events until the equipment platforms themselves fail.

Another highly desirable feature of the present invention is that it allows seismic resistant equipment platforms to be located within a conventional raised floor. The pedestal heads are configured to accept the various stringers used in conventional raised floor systems (for supporting conventional floor panels), as well as the equipment mounting plates of the present invention. In this manner, equipment mounting plates may be used only where needed (e.g., underneath equipment) and inexpensive conventional floor panels may be used to complete the raised floor. In a preferred embodiment, each grouping of seismic resistant equipment mounting plates is only loosely coupled to the remaining conventional raised floor.

Further features of the invention, its nature and various advantages, will be apparent from the accompanying drawings and the following detailed description of the preferred embodiments.

DETAILED DESCRIPTION OF THE PREFERRED EMBODIMENTS

Figure 1:
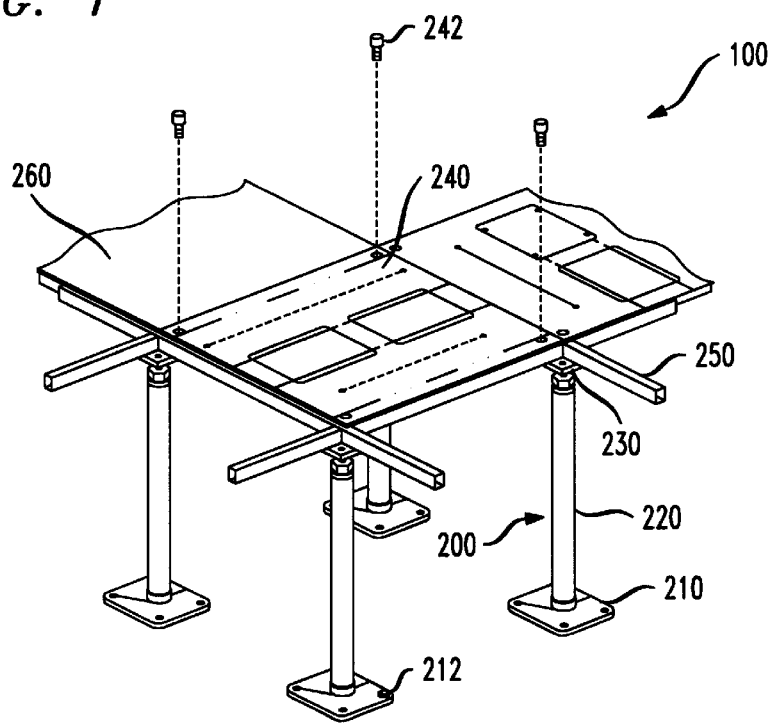
FIG. 1 is a perspective view of an illustrative seismic resistant equipment platform made in accordance with this invention.

In the illustrative embodiment shown in FIG. 1, a seismic resistant equipment platform 100 is constructed from a plurality of seismic resistant pedestals 200 interconnected by equipment mounting plates 240. Each seismic resistant pedestal 200 comprises a base plate 210 bolted to a subfloor (not shown) via a plurality of anchoring bolts 212, a column 220 coupled to base plate 210, and a seismic resistant pedestal head 230 coupled to column 220. Equipment mounting plates 240 are secured to pedestal heads 230 with hexagonal screws 242 (hereinafter "hex screws 242") to form a rigid equipment platform comprising at least four seismic resistant pedestals 200 and at least one equipment mounting plate 240. A plurality of stringers 250 may also be interconnected between seismic resistant pedestals 200 to allow conventional floor panels 260 to be substituted for equipment mounting plates 240 as described below.

Figure 2:
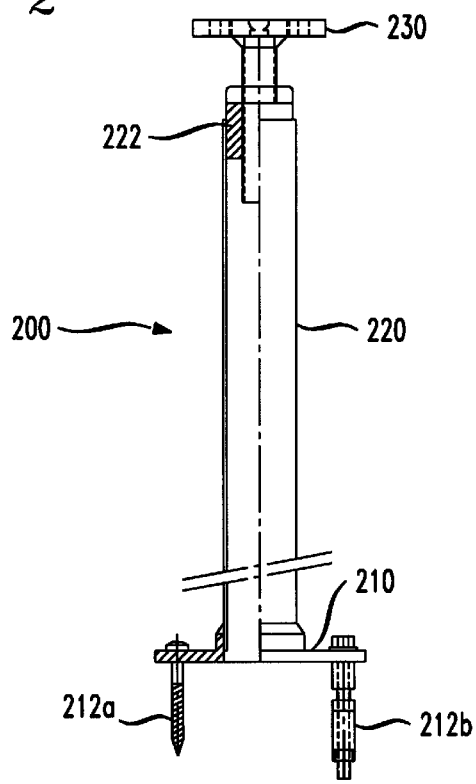
FIG. 2 is a cross-sectional view of a seismic resistant pedestal made in accordance with this invention.

FIG. 2 shows a cross-sectional view of seismic resistant pedestal 200. As seen in FIG. 2, each base plate 210 is anchored to a subfloor (not shown) via anchoring bolts 212. In a preferred embodiment, anchoring bolts 212a are used in seismic zone 0 and zone 1 locations and may comprise, for example, HILTI-⅜" KWIK-CON anchors, while anchoring bolts 212b are used in seismic zone 2–4 locations and may comprise, for example, HILTI-HSL M 10/20 metric heavy-duty expansion anchors. It is understood that other anchoring means may be used.

Coupled to base plate 210, preferably by a 360° weld, is column 220. Column 220 comprises a substantially hollow shaft with a threaded receptacle 222 disposed at one end (for rigidly coupling seismic pedestal head 230 to column 220 to complete seismic resistant pedestal 200 as described below). In a preferred embodiment, column 220 is constructed of a ductile material, thereby providing seismic resistant pedestal 200 with a substantially plastic failure mode. Moreover, column 220 is preferably provided with sufficient stiffness to elastically restore at least one quarter of the force likely to be experienced by a seismic resistant equipment platform (supporting equipment) during a seismic event in a zone 4 location (when column 220 is used as part of the seismic resistant equipment platform).

Figure 3:
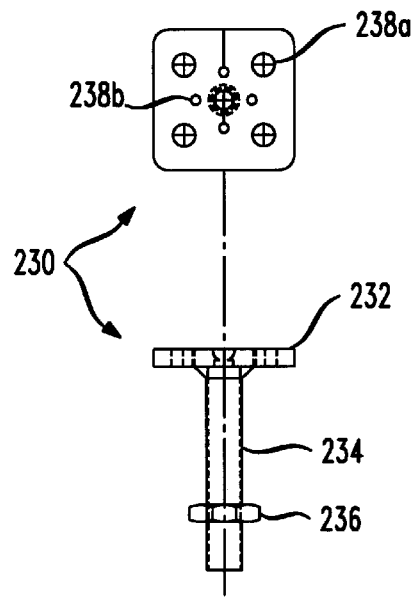
FIG. 3 is a cross-sectional side view and top view of a seismic resistant pedestal head made in accordance with this invention.

FIG. 3 shows a cross sectional side view and a top view of seismic resistant pedestal head 230. Seismic resistant pedestal head 230 comprises a pedestal head plate 232 coupled to a threaded pedestal head shaft 234, and a locking nut 236. Pedestal head plate 232 further comprises threaded holes 238a (for mounting equipment mounting plates 240 to seismic resistant pedestal head 230 via hex screws 242) and threaded holes 238b (for mounting stringers 250 to seismic resistant pedestal head 230).

In operation, threaded pedestal head shaft 234 is threaded into threaded receptacle 222 of column 220 with locking nut 236 positioned near the bottom of pedestal head plate 232 (to allow threaded pedestal head shaft 234 to rotate). Once a desired pedestal height is reached, the height of seismic resistant pedestal 200 is checked relative to the height of other seismic resistant pedestals 200 which will be part of seismic resistant equipment platform 100 to determine if seismic resistant equipment platform 100 will be level. If seismic resistant equipment platform 100 is part of a floor system (e.g., if seismic resistant equipment platform 100 is located within a conventional raised floor), the height of seismic resistant pedestal 200 is checked relative to the height of all other pedestals which will be part of the floor system. (Level may be checked, for example, by using a laser beam.) Leveling of seismic resistant equipment platform 100 is accomplished by rotating threaded pedestal head shafts 234 of seismic resistant pedestals 200 until the heights of seismic resistant pedestals 200 are substantially identical. In this manner, the height of each seismic resistant pedestal 200 is individually set and seismic resistant equipment platform 100 is then leveled. Preferably locking nut 236 is not tightened against column 220 (thus allowing further rotation of threaded pedestal head shaft 234) until equipment mounting plates 240 have been bolted to pedestal heads 230 via hex screws 242. However, once locking nut 236 has been tightened against column 220, locking nut 236 serves the dual purpose of preventing further rotation of threaded pedestal head shaft 234 and eliminating "vertical chatter" (i.e., up and down movement of threaded pedestal head shaft 234 within column 220 during a seismic event due to the spacings between the threads of threaded pedestal head shaft 234) within each seismic resistant pedestal 200.

It should be further noted that conventional pedestal heads (not shown) may be used with bases 210 and columns 220, if so desired, to form pedestals for supporting conventional floor panels. For such pedestals, locking nut 236 is replaced with a leveling nut which is threaded onto the threaded shaft of each conventional pedestal head and which rests against the top of column 220 to set the height of each pedestal. In this manner, the height of each pedestal is adjusted by adjusting each conventional pedestal head's leveling nut. Preferably, conventional pedestal heads are left loosely coupled to columns 220 (e.g., by simply inserting conventional pedestal heads into columns 220 rather than fastening the pedestal heads to columns 220) so that a conventional raised floor formed from such pedestals is decoupled from columns 220 and bases 210 (to relieve strain on any seismic resistant equipment platforms coupled to the conventional raised floor).

Figure 4:
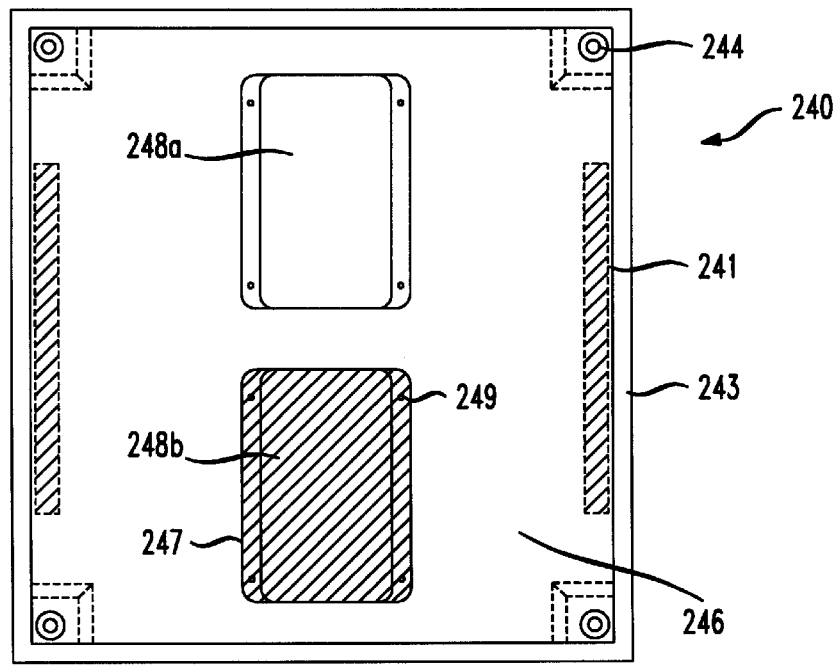
FIG. 4 is a top view of an equipment mounting plate made in accordance with this invention.

FIG. 4 shows an illustrative embodiment of equipment mounting plate 240. Each equipment mounting plate 240 is preferably substantially rectangular (although other shapes such as triangular, pentagonal, or hexagonal may be used) and is preferably constructed of a material (e.g., aluminum) with sufficient stiffness to render equipment mounting plate deformations negligible during seismic event loading (e.g., each equipment mounting plate may be treated as a rigid body and equipment mounting plate deformations may be neglected during force analysis). Because in a preferred embodiment equipment mounting plates 240 are constructed of solid aluminum, equipment mounting plates 240 weigh more than most conventional floor panels 260 (which are typically formed of sheet metal covered with a plastic surface or similar materials). To reduce the additional weight provided by each equipment mounting plate 240, material is removed from the backside of each equipment mounting plate (as depicted by locations 241 of FIG. 4). The weight of each equipment mounting plate is further reduced by machining a ridge 243 along the underside of the outside edges of each equipment mounting plate 240, which allows each equipment mounting plate 240 to be mounted to pedestal heads 230 without being obstructed by stringers 250.

Each equipment mounting plate 240 further comprises a plurality of pedestal mounting holes 244, equipment mounting areas 246, cabling area covers 247 and cabling areas 248. Pedestal mounting holes 244, preferably disposed on the outside corners of equipment mounting plate 240, allow equipment mounting plate 240 to be secured to seismic resistant pedestals 200 by threading hex screws 242 through pedestal mounting holes 244 into threaded holes 238a of pedestal head plate 232. Equipment mounting areas 246 allow equipment or equipment racks to be attached to equipment mounting plate 240 by drilling through equipment mounting plate 240 at these locations and by then attaching equipment to equipment mounting plate 240 with any number of fastening means known in the art. Cabling areas 248 are provided for equipment cabling and comprise openings in equipment mounting plate 240 for placing cables through equipment mounting plate 240 (e.g., area 248a of FIG. 4) which may be covered by cabling area covers 247 when not in use (as shown at area 248b of FIG. 4), cabling area covers 247 attaching to equipment mounting plate 240 via cable cover screws 249.

Seismic resistant equipment platforms are thereby constructed as follows: a plurality of seismic resistant pedestals 200 are mounted to a subfloor via anchoring bolts 212. The height of pedestal head 230 on each pedestal 200 is adjusted to provide a level surface for equipment mounting plates 240. Equipment mounting plates 240 are then rigidly mounted to seismic resistant pedestals 200 by threading hex nuts 242 through pedestal mounting holes 244 (of each equipment mounting plate 240) into threaded holes 238a of pedestal head plates 232 (of seismic resistant pedestal heads 230). Locking nut 236 on each threaded pedestal head shaft 234 is then tightened. By rigidly coupling seismic resistant pedestals 200 to a subfloor and interconnecting these pedestals by equipment mounting plates 240, the stiffness of the subfloor is operatively transferred to equipment mounting plates 240 (i.e., a piece of equipment will experience substantially the same level of seismic stability whether it is mounted directly to the subfloor or mounted to an equipment mounting plate 240 of seismic resistant platform 100). Note that the actual stiffness of the subfloor (which may be tens of thousands of pounds for a concrete floor) is not transferred to equipment mounting plate 240; adequate stiffness to support equipment (e.g., approximately two thousand pounds in a preferred embodiment) is transferred to equipment mounting plate 240. Further, because each equipment mounting plate is sufficiently stiff to constitute a rigid body, the stiffnesses of pedestals 200 add when pedestals 200 are interconnected by equipment mounting plates 240. In this manner, the overall stiffness of equipment platform 100 is equal to the sum of the stiffnesses of all pedestals 200 interconnected by equipment mounting plates 240.

In addition to being used as stand-alone platforms, the seismic resistant equipment mounting platforms of the present invention may be used to provide selective seismic stability to a conventional raised floor. Pedestal heads 230 are configured to accept both equipment mounting plates 240 (via threaded holes 238*a*) and the various stringers 250 (via threaded holes 238*b*) used to support conventional floor panels 260 in conventional raised floor systems. It is understood that pedestal heads 230 may also be configured to allow conventional floor panels 260 to be mounted directly to pedestal heads 230, or alternatively, that conventional pedestal heads (which are already configured to accept conventional floor panels 260) may be used in conjunction with bases 210 and columns 220 to form pedestals (as previously described). In either case, equipment mounting plates 240 may be used only were needed (e.g., underneath equipment) and inexpensive conventional floor panels 260 may be used to complete a raised floor. In a preferred embodiment, each grouping of seismic resistant equipment mounting plates 240 is loosely coupled to the remaining conventional raised floor. In this manner, equipment mounting platforms are only required to support equipment and not ancillary flooring which may be inexpensively repaired if damaged during a seismic event. When seismic resistant pedestal heads 230 are used to support conventional floor panels 260, loose coupling is achieved by not tightening locking nuts 236 against columns 220. On the other hand, when conventional pedestal heads are used in conjunction with bases 210 and columns 220, loose coupling is achieved by simply inserting the pedestal heads into columns 220 (e.g., conventional pedestal heads are left free floating on columns 220).

It will be understood that the foregoing is only illustrative of the principles of the invention and that various modifications can be made by those skilled in the art without departing from the scope and spirit of the invention. For example, the invention can be used to provide seismic stability to any type of raised platform. Furthermore, the various dimensions and materials mentioned herein are preferred, but other dimensions and materials can be used if desired. As well, other methods of interconnecting equipment mounting plates to pedestals, pedestals to subfloors, pedestals heads to columns, and columns to base plates may be employed.

What is claimed is:

1. An equipment platform comprising:
   a plurality of pedestals rigidly secured to a surface with a given stiffness, wherein each of said pedestals comprises a base plate rigidly coupled to said surface, a column rigidly coupled to said base plate, and a pedestal head rigidly coupled to said column; and
   an equipment mounting plate, said equipment mounting plate interconnecting a plurality of said pedestals by being rigidly secured to a portion of a plurality of said pedestal heads, said pedestals constructed so as to operatively transfer the stiffness of said surface to said equipment mounting plate, said equipment mounting plate is of sufficient stiffness that the stiffness of said equipment platform comprises the sum of the stiffnesses of each pedestal interconnected by said equipment mounting plate.

2. The equipment platform defined in claim 1 wherein said pedestals have a substantially plastic failure mode.

3. The equipment platform defined in claim 1 wherein each pedestal has at least one quarter the stiffness sufficient to withstand a zone 4 seismic event without suffering inelastic deformation when equipment is mounted on said equipment platform.

4. The equipment platform defined in claim 3 wherein said equipment mounting plate is coupled to at least four pedestals so that the equipment platform stiffness is sufficient to withstand at least a zone 4 seismic event without suffering inelastic deformation when equipment is mounted on said equipment platform.

5. The equipment platform defined in claim 1 wherein equipment is coupled to said equipment mounting plate.

6. The equipment platform defined in claim 1 wherein said equipment platform is coupled to a conventional raised floor system.

7. The equipment platform defined in claim 1 wherein a plurality of stringers interconnect said pedestal heads.

8. The equipment platform defined in claim 1 wherein each pedestal head is configured to accept both conventional floor panels and said equipment mounting plate.

9. The equipment platform defined in claim 1 further comprising a plurality of equipment mounting plates for interconnecting a plurality of said pedestals.

10. A method for providing a stabilized raised platform comprising the steps of:
    securing a plurality of pedestals rigidly to a subfloor of a given stiffness;
    securing an equipment mounting plate rigidly to a plurality of said pedestals;
    constructing said pedestals so as to operatively transfer the stiffness of said subfloor to said equipment mounting plate when said equipment mounting plate is rigidly secured to a plurality of said pedestals; and
    providing said equipment mounting plate with sufficient stiffness so that the stiffness of said raised platform comprises the sum of the stiffnesses of each pedestal interconnected by said equipment mounting plate.

11. The method defined in claim 10 further comprising the step of:
    providing a plastic failure mode for said pedestals.

12. The method defined in claim 10 further comprising the step of:
    providing each pedestal with at least one quarter of the stiffness sufficient to withstand a zone 4 seismic event without suffering inelastic deformation when equipment is mounted on said raised platform.

13. The method defined in claim 12 further comprising the step of:
    interconnecting at least four pedestals to said equipment mounting plate so that the raised platform stiffness is sufficient to withstand at least a zone 4 seismic event without suffering inelastic deformation when equipment is mounted on said raised platform.

14. The method defined in claim 9 further comprising the step of:

coupling equipment to said equipment mounting plate.

15. The method defined in claim 9 further comprising the step of:

coupling said raised platform to a conventional raised floor system.

16. The method defined in claim 9 further comprising the step of:

interconnecting said pedestals with a plurality of stringers.

17. The method defined in claim 9 further comprising the step of:

constructing said pedestals so as to accept both conventional floor panels and said equipment mounting plate.

18. The method defined in claim 9 further comprising the step of:

securing a plurality of equipment mounting plates to a plurality of said pedestals.

19. An apparatus for selectively providing seismic stability within a raised floor comprising:

a plurality of seismic resistant pedestals rigidly secured to a subfloor, wherein each of said seismic resistant pedestals comprises a seismic resistant base plate rigidly coupled to said subfloor, a seismic resistant column rigidly coupled to said seismic resistant base plate, and a seismic resistant pedestal head rigidly coupled to said seismic resistant column;

a seismic resistant equipment mounting plate, said seismic resistant equipment mounting plate interconnecting a plurality of said seismic resistant pedestals to form a seismic resistant equipment platform, said seismic resistant equipment mounting plate being rigidly secured to a portion of a plurality of said seismic resistant pedestal heads; and a plurality of conventional floor panels interconnecting said seismic resistant columns and seismic resistant base plates at locations not interconnected by said seismic resistant equipment mounting plate.

20. The apparatus defined in claim 19 wherein said seismic resistant pedestals have a substantially plastic failure mode.

21. The apparatus defined in claim 19 wherein said seismic resistant equipment mounting plate is of sufficient stiffness that the stiffness of said seismic resistant equipment platform comprises the sum of the stiffnesses of each seismic resistant pedestal interconnected by said seismic resistant equipment mounting plate.

22. The apparatus defined in claim 19 wherein each seismic resistant pedestal has at least one quarter the stiffness sufficient to withstand a zone 4 seismic event without suffering inelastic deformation when equipment is mounted on said seismic resistant equipment platform.

23. The apparatus defined in claim 22 wherein said seismic resistant equipment mounting plate is coupled to at least four seismic resistant pedestals to form a rigid body with a stiffness sufficient to withstand at least a zone 4 seismic event without said rigid body suffering inelastic deformation when equipment is mounted on said seismic resistant equipment platform.

24. The apparatus defined in claim 19 wherein equipment is coupled to said seismic resistant equipment mounting plate.

25. The apparatus defined in claim 19 wherein a plurality of stringers interconnect said seismic resistant pedestal heads.

26. The apparatus defined in claim 19 wherein each seismic resistant pedestal head is configured to accept both conventional floor panels and said seismic resistant equipment mounting plate.

27. The apparatus defined in claim 19 further comprising a plurality of seismic resistant equipment mounting plates for forming a plurality of seismic resistant equipment platforms within said raised floor.

\* \* \* \* \*